(12) United States Patent
Xu et al.

(10) Patent No.: US 10,566,717 B2
(45) Date of Patent: Feb. 18, 2020

(54) CARD EDGE CONNECTOR AND ASSEMBLY THEREOF

(71) Applicant: FOXCONN INTERCONNECT TECHNOLOGY LIMITED, Grand Cayman (KY)

(72) Inventors: Guang-Lei Xu, Kunshan (CN); Kuo-Chun Hsu, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/055,538

(22) Filed: Aug. 6, 2018

(65) Prior Publication Data

US 2019/0044266 A1 Feb. 7, 2019

(30) Foreign Application Priority Data

Aug. 4, 2017 (CN) .......................... 2017 1 0660679

(51) Int. Cl.
| | |
|---|---|
| *H01R 12/72* | (2011.01) |
| *H01R 12/71* | (2011.01) |
| *H05K 7/20* | (2006.01) |
| *H01R 13/627* | (2006.01) |
| *H01R 12/70* | (2011.01) |
| *H01R 13/405* | (2006.01) |

(52) U.S. Cl.
CPC ....... *H01R 12/721* (2013.01); *H01R 12/7005* (2013.01); *H01R 12/716* (2013.01); *H01R 13/405* (2013.01); *H01R 13/6271* (2013.01); *H05K 7/2039* (2013.01)

(58) Field of Classification Search
CPC ............ H01R 12/7005; H01R 12/7082; H01R 12/716; H01R 12/72; H01R 12/721; H01R 12/724; H01R 12/73; H01R 12/88; H01R 13/405; H01R 13/621; H01R 13/6215; H01R 13/6271; H05K 7/2039
See application file for complete search history.

(56) References Cited

U.S. PATENT DOCUMENTS 2,923,911 A * 2/1960 Demurjian ............. H01R 12/88
439/329
4,695,258 A * 9/1987 Hanson .................. H01R 12/79
439/329

(Continued)

FOREIGN PATENT DOCUMENTS

CN 2599791 Y 1/2004

*Primary Examiner* — Oscar C Jimenez
(74) *Attorney, Agent, or Firm* — Wei Te Chung; Ming Chieh Chang

(57) ABSTRACT

A card edge connector includes an insulative housing and a number of terminals retained in the insulative housing. The insulative housing defines a slot going through a front surface thereof to receive an electrical card. Each terminal includes a contacting portion extending into the slot and a tail extending out of the insulating housing. The insulative housing has a retaining wall above the slot. The card edge connector further includes a nut retained in the retaining wall, and cooperating with an external retaining member to fix the heat dissipation module to the insulative housing. The card edge connector can be adapted to expand the module of the existing electrical card to meet diverse needs of customers.

20 Claims, 6 Drawing Sheets

(56) References Cited

U.S. PATENT DOCUMENTS

| | | | | |
|---|---|---|---|---|
| 5,494,451 A * | 2/1996 | Bowers | H05K 7/1405 | 439/328 |
| 6,278,610 B1 * | 8/2001 | Yasufuku | H05K 7/1431 | 165/185 |
| 6,332,792 B1 * | 12/2001 | Lin | H05K 7/1431 | 439/160 |
| 6,361,358 B1 * | 3/2002 | Kajinuma | H01R 13/6215 | 439/329 |
| 6,545,872 B1 * | 4/2003 | Lonergan | H01R 12/721 | 174/252 |
| 6,592,380 B2 * | 7/2003 | Miyazawa | H01R 12/592 | 439/329 |
| 10,003,153 B1 * | 6/2018 | Lai | H01R 13/516 | |
| 10,181,665 B2 * | 1/2019 | Ooshiro | H01R 12/52 | |
| 2005/0287834 A1 * | 12/2005 | Nishimura | H01R 12/592 | 439/67 |
| 2006/0234523 A1 * | 10/2006 | Baranski | H01Q 1/1271 | 439/67 |
| 2009/0239404 A1 * | 9/2009 | Chen | H01R 13/748 | 439/345 |
| 2010/0062624 A1 * | 3/2010 | Tsai | H05K 7/16 | 439/74 |
| 2012/0257360 A1 * | 10/2012 | Sun | H01R 12/7052 | 361/748 |
| 2013/0109217 A1 * | 5/2013 | Yeh | H01R 13/621 | 439/345 |
| 2014/0148034 A1 * | 5/2014 | Kashiwada | H01R 13/512 | 439/345 |
| 2014/0302692 A1 * | 10/2014 | Raff | H01R 12/716 | 439/65 |
| 2014/0315418 A1 * | 10/2014 | Ju | H01R 12/79 | 439/366 |
| 2016/0044799 A1 * | 2/2016 | Igari | H05K 5/006 | 361/752 |
| 2016/0156117 A1 * | 6/2016 | Wang | H01R 12/714 | 439/65 |
| 2018/0309213 A1 * | 10/2018 | Harmon, III | H01R 12/7005 | |

* cited by examiner

CARD EDGE CONNECTOR AND ASSEMBLY THEREOF

BACKGROUND OF THE INVENTION

1. Field of the Invention

The present invention relates to a card edge connector, and particularly to a card edge connector applied to an expansion module.

2. Description of Related Art

Chinese Patent No. CN2599791Y discloses an electrical card edge connector including an insulative housing and a plurality of upper and lower terminals retained in the insulative housing. The insulative housing includes a base and a pair of arms extending forwardly from two opposite sides thereof. The base has a mounting surface mounted to a motherboard and an engaging surface perpendicular to the mounting surface. The base further includes an upper wall, a lower wall, a pair of side walls and a rear wall connecting therebetween. A receiving groove is defined by the upper wall, the lower wall, the side walls and the rear wall to receive an electrical card. The electrical card edge connector can't be adapted to expand the module of the existing electrical card to meet diverse needs of customers.

Therefore, it is desired to provide a new card edge connector.

SUMMARY OF THE INVENTION

To achieve the above desire, the present invention provides a card edge connector comprising an insulative housing and a plurality of terminals retained in the insulative housing. The insulative housing defines a slot going through a front surface thereof to receive an electrical card. Each terminal includes a contacting portion extending into the slot and a tail extending out of the insulative housing. The insulative housing has a retaining wall located above the slot. The card edge connector further includes a nut retained in the retaining wall, cooperating with an external retaining member to fix the heat dissipation module to the insulative housing.

DETAILED DESCRIPTION OF THE PREFERRED EMBODIMENT

Figure 1:
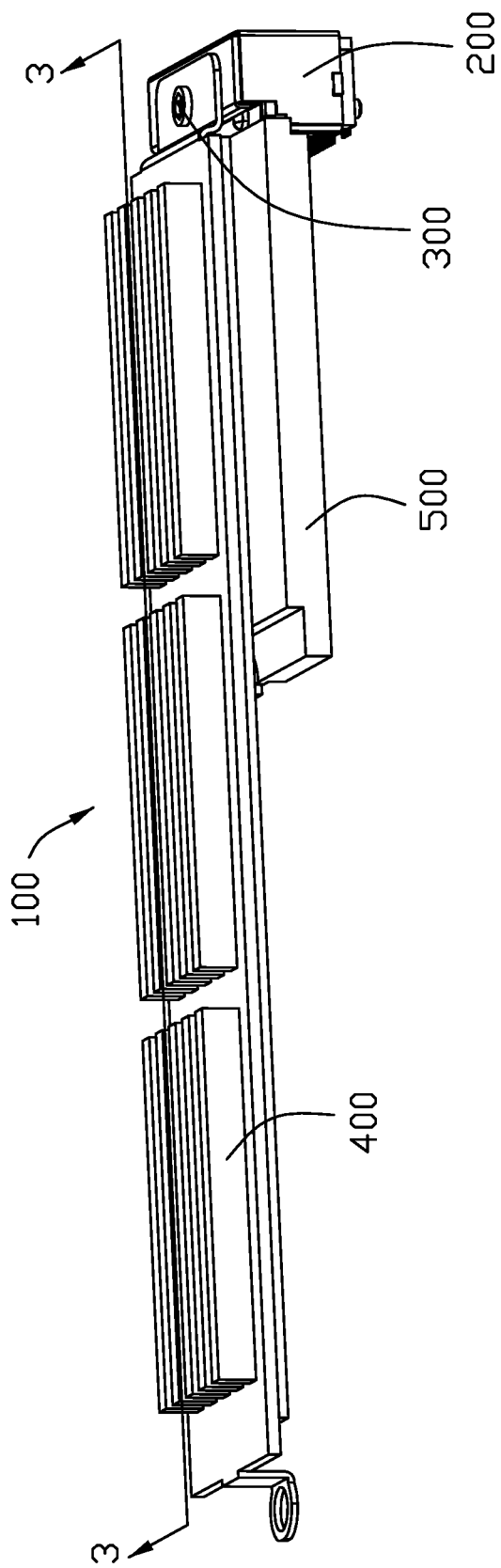
FIG. 1 is a perspective view of a card edge connector assembly according to the invention.
Figure 2:
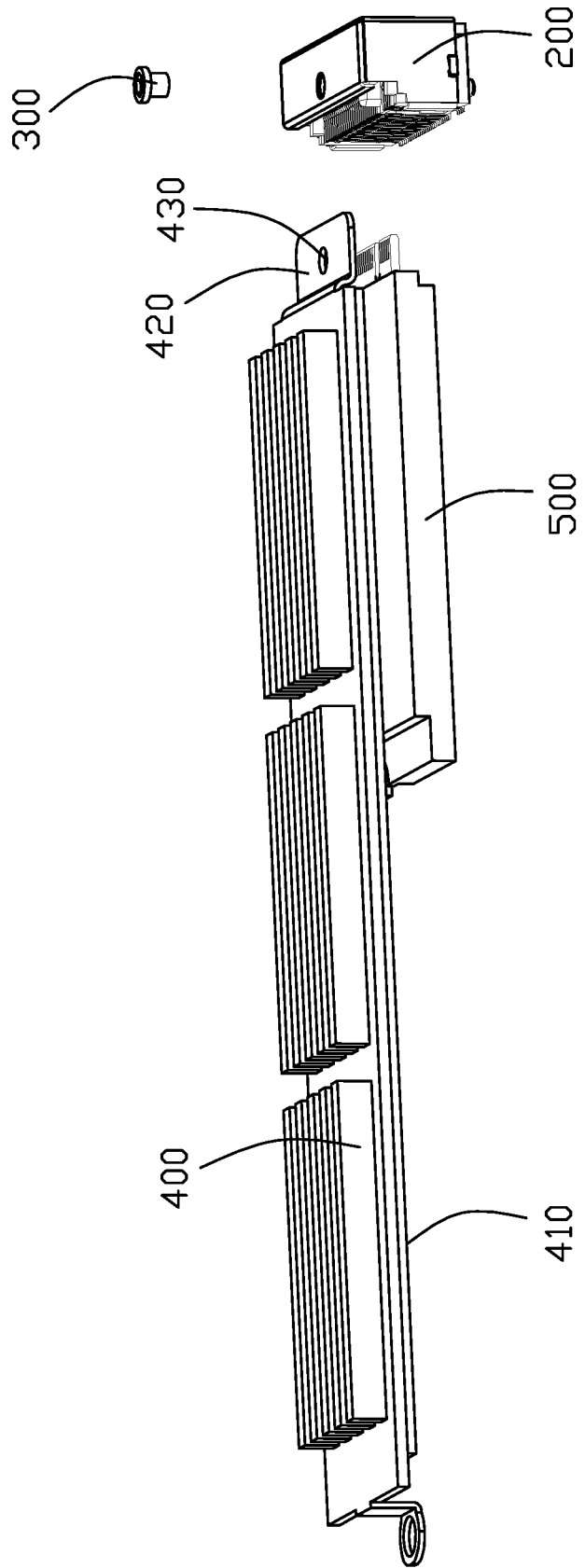
FIG. 2 is an exploded view of the card edge connector assembly of FIG. 1.
Figure 3:
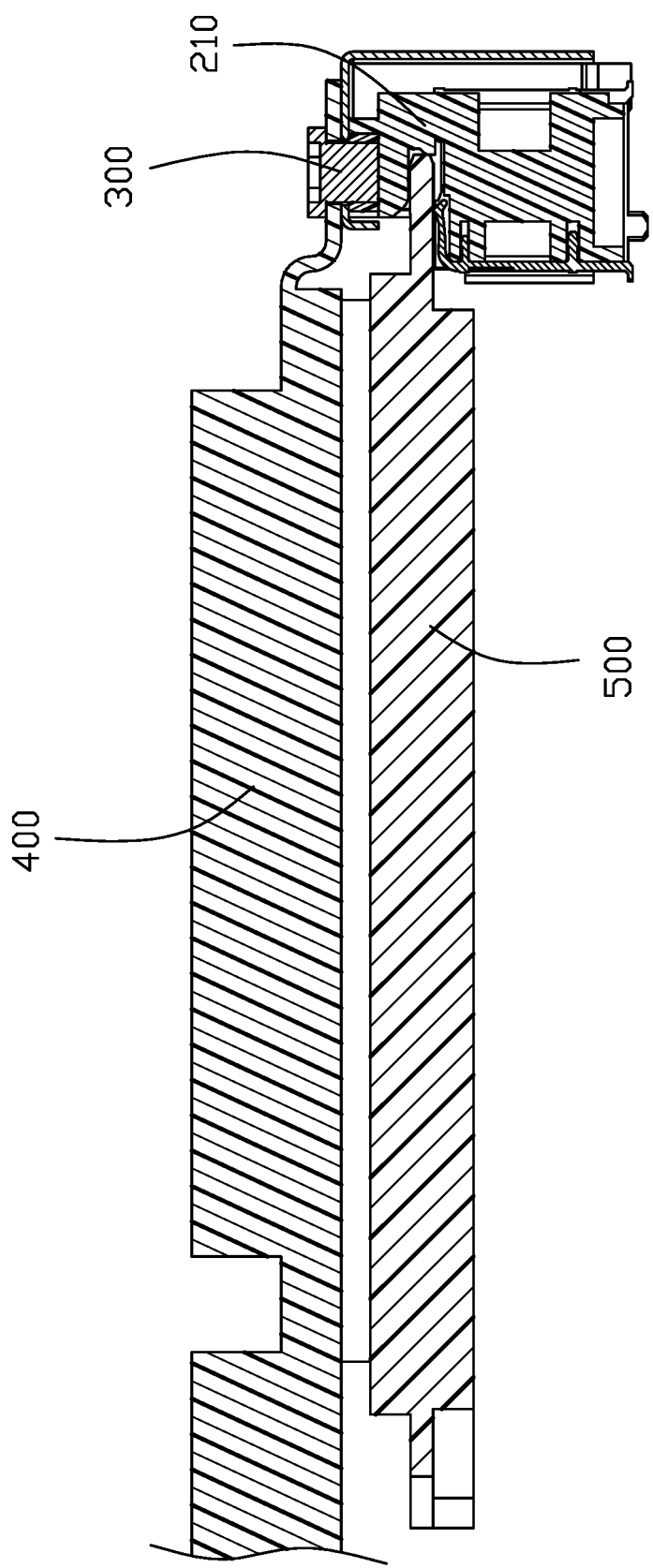
FIG. 3 is a cross-sectional view of the card edge connector assembly taken along line 3-3 in FIG. 1.

Referring to FIGS. 1-6, a card edge connector assembly 100 includes a card edge connector 200 soldered to a circuit board (not shown), a bolt 300, a nut 213, an electrical card 500, and a heat dissipation module 400. The electrical card 500 is inserted into the card edge connector 200 to establish an electrical connection between the electrical card 500 and the circuit board. The heat dissipation module 400 and the electrical card 500 mounted on the same side of the card edge connector 200 are parallel to each other. Notably, the heat dissipation module 400 is discrete and separable from the electrical card 500. The bottom surface of the heat dissipation module 400 has a patch 410 abutting against the top surface of the electrical card 500 to dissipate heat generated when the electrical card 500 working. The patch 410 with certain elasticity is such as a thermal conductive rubber or a thermal conductive cotton.

Figure 4:
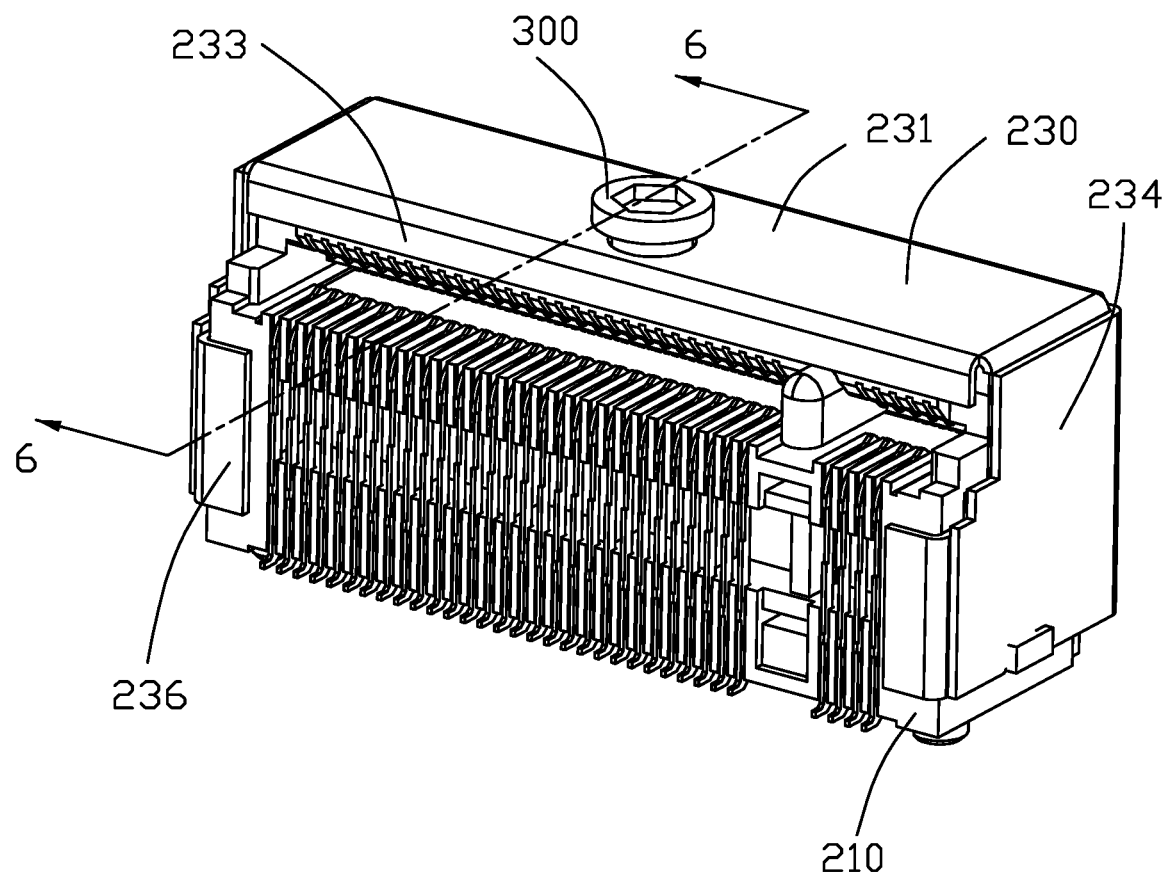
FIG. 4 is a perspective view of the card edge connector of FIG. 1.
Figure 5:
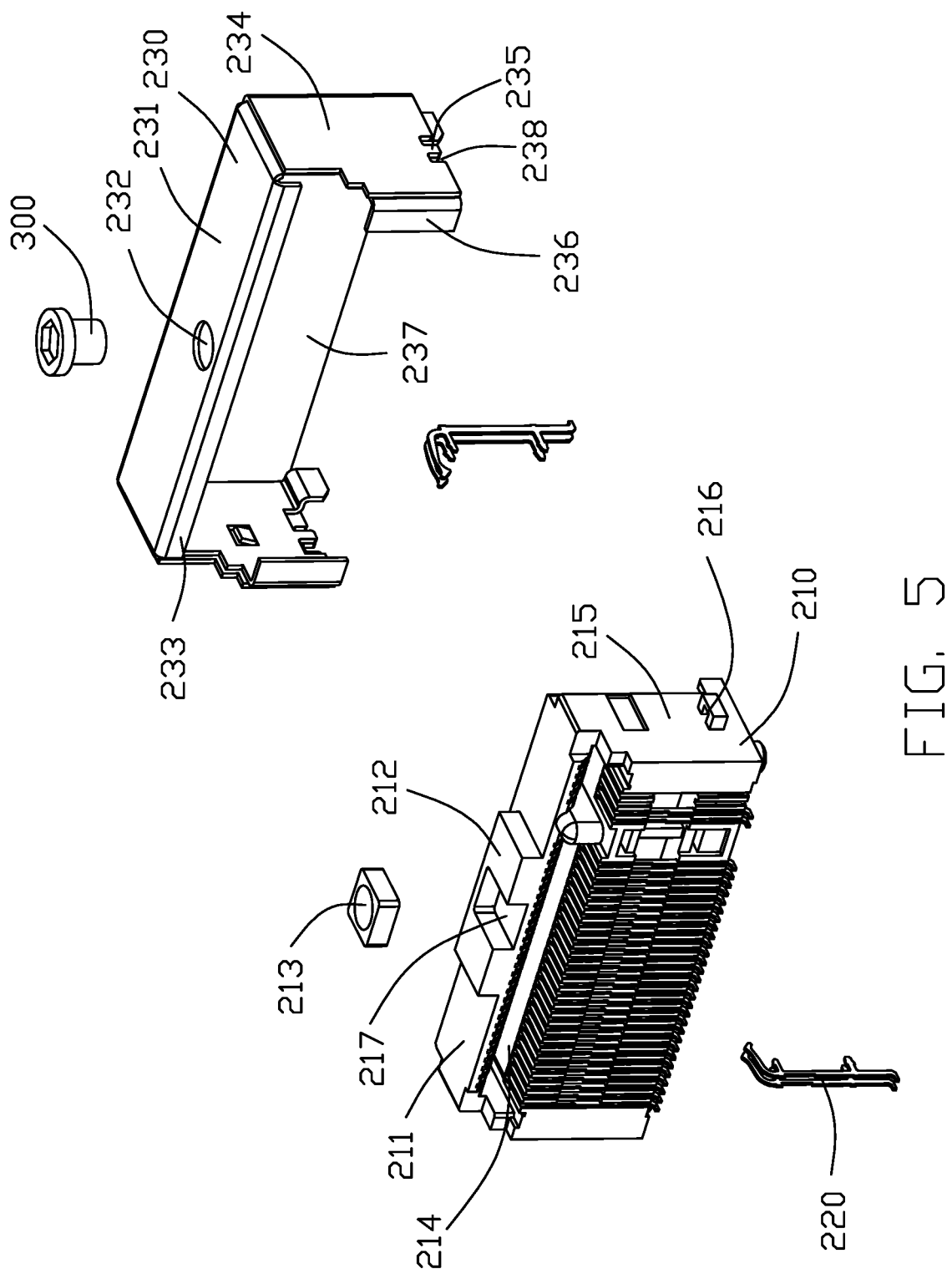
FIG. 5 is an exploded view of the card edge connector of FIG. 4.
Figure 6:
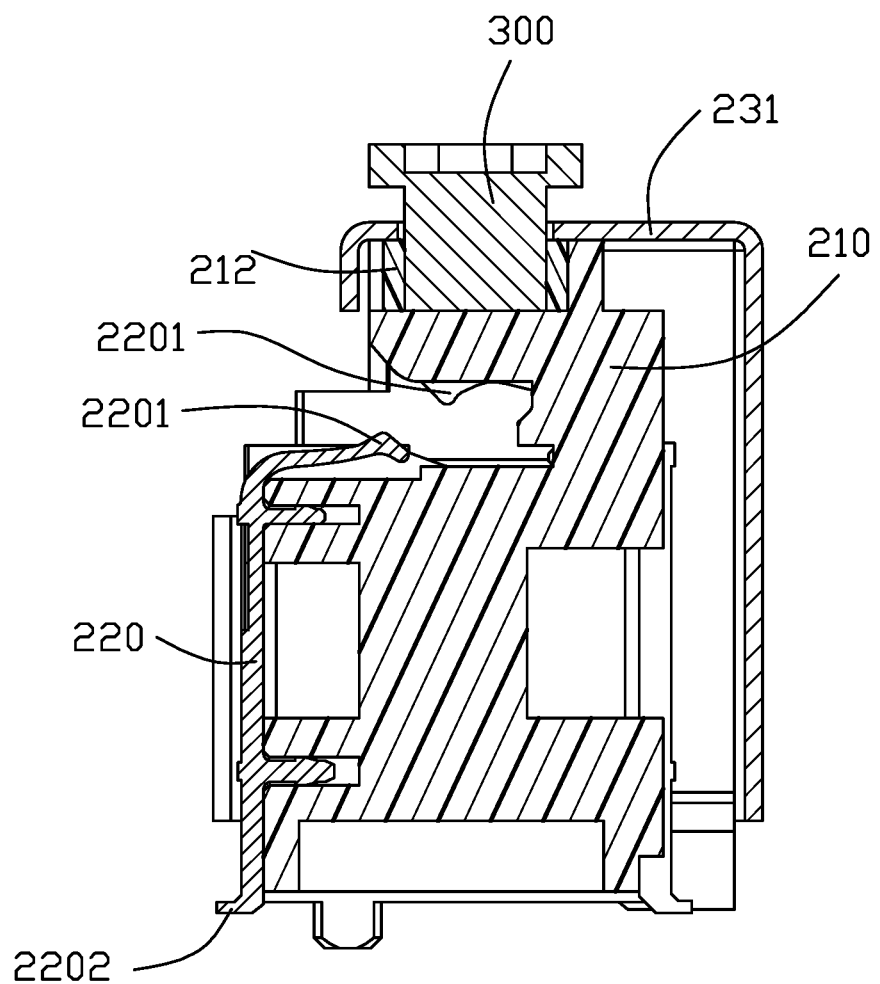
FIG. 6 is a cross-sectional view of the card edge connector taken along line 6-6 in FIG. 4.

Referring to FIGS. 4 to 6, the card edge connector 200 includes an insulative housing 210, a plurality of terminals 220 retained in the insulative housing 210, a nut 213 retained in the insulative housing 210, and a shell 230 covering the insulative housing 210. The insulative housing 210 defines a slot 214 going through the front surface thereof. Each terminal 220 includes a contacting portion 2201 extending into the slot 214 and a tail 2202 extending out of the insulative housing 210. The electrical card 500 is inserted into the slot 214 to establish an elastic connection with the contacting portion 2201. In this embodiment, the terminals 220 are arranged in two rows.

The insulative housing 210 has a retaining wall 211 located above the slot 214. The retaining wall 211 has a protrusion 212 defining a recess 217 to receive the nut 213. The nut 213 cooperates with the bolt 300 to fix the heat dissipation module 400. The shell 230 is made of a metal sheet and includes a top wall 231, two side walls 234 extending downwardly from the top wall 231, and a rear wall 237. Those walls enclose the corresponding wall of the insulative housing 210, respectively. The two side surfaces 215 of the insulative housing 210 define two latching slots 216 extending outwardly, respectively. The bottom of the side wall 234 defines two cutouts 238 and a latching portion 235 extending downwardly therebetween. The latching portion 235 is downwardly inserted into the latching slot 216 to fix the shell 230 to the insulative housing 210. The front edge of the top wall 231 is bent downwardly to form a vertical portion 233 locking with the front surface of the protrusion 212. The front edge of the side wall 234 is bent inwardly to form a covering portion 236. The covering portion 236 locks with the front surface of the insulative housing 210. The top wall 231 defines a through hole 232 aligning with the nut 213 retained in the recess 217. Referring to FIG. 1, the heat dissipation module 400 has an ear portion 420 located above the top wall 231, and the ear portion 420 defines a mounting hole 430 aligned with the through hole 232. The bolt 300 is fixed to the nut 213 in the recess 217 through the mounting hole 430 and the through hole 232, respectively.

However, the disclosure is illustrative only, changes may be made in detail, especially in matter of shape, size, and arrangement of sections within the principles of the invention. In a technical viewpoint, the invention essentially discloses an insulative housing defining a module receiving slot extending along a transverse direction and communicating with an exterior in a front-to-back direction perpendicular to the transverse direction. A plurality of contacts are disposed in the housing with corresponding contacting section extending into the module receiving slot. A metallic shell encloses the housing. A module has a front edge region received within the module receiving slot. A heat sink is intimately positioned upon the module in a vertical direction perpendicular to both the transverse direction and the frontto-back direction, and fixed to at least one of said housing and shell so as to remove the corresponding heat generated by the module.

What is claimed is:

1. A card edge connector comprising:
    an insulative housing defining a slot going through a front surface thereof to receive an electrical card and a retaining wall located above the slot;
    a plurality of terminals retained in the insulative housing, each terminal including a contacting portion extending into the slot and a tail extending out of the insulative housing; wherein
    the card edge connector includes a nut retained in the retaining wall, and the nut cooperates with an external retaining member to fix an external additional module; wherein
    the external retaining member upwardly protrudes above a top surface of the housing so as to have an ear portion of the external additional module positioned above the top surface of the housing and downwardly pressed by the external retaining member.

2. The card edge connector as claimed in claim 1, wherein the retaining wall has a protrusion defining a recess to receive the nut.

3. The card edge connector as claimed in claim 2, wherein the card edge connector has a shell covering the insulative housing, and the shell includes a top wall defining a through hole aligned with the recess, two side walls extending downwardly from the top wall, and a rear wall.

4. The card edge connector as claimed in claim 3, wherein the insulative housing defines a latching slot at a lateral wall thereof, the shell has a latching portion extending downwardly at the side wall thereof, the latching portion is downwardly inserted into the latching slot.

5. The card edge connector as claimed in claim 3, wherein the front edge of the top wall is bent downwardly to form a vertical portion locking with the front surface of the protrusion.

6. The card edge connector as claimed in claim 5, wherein the front edge of the side wall is bent inwardly to form a covering portion locking with the front surface of the insulative housing.

7. A card edge connector assembly comprising:
    a card edge connector having an insulative housing and a plurality of terminals retained in the insulative housing, the insulative housing including a slot and a retaining wall above the slot, the terminal including a contacting portion extending into the slot;
    an external retaining member mounted to the card edge connector;
    an electrical card inserted into the slot;
    an external additional module extending along a front-back direction parallel to the electrical card; wherein
    the card edge connector includes a nut retained in the retaining wall, cooperating with the external retaining member to fix the external additional module to the insulative housing; wherein
    the external additional module is discrete and separable from the electrical card.

8. The card edge connector assembly as claimed in claim 7, wherein the external additional module is a heat dissipation module, and the bottom surface of the heat dissipation module is of a thermal conductive cotton or a thermal conductive rubber.

9. The electrical connector as claimed in claim 8, wherein the external retaining member is a bolt.

10. The electrical connector as claimed in claim 9, wherein the heat dissipation module includes an ear portion located above the retaining wall, and the ear portion defines a mounting hole aligned with the nut.

11. An electrical connector assembly comprising:
    an insulative housing defining a module receiving slot extending along a transverse direction and communicating with an exterior in a front-to-back direction perpendicular to the transverse direction;
    a plurality of contacts disposed in the housing with corresponding contacting section extending into the module receiving slot;
    a metallic shell enclosing the housing;
    a module having a front edge region received within the module receiving slot;
    a heat sink intimately positioned upon a top side of the module in a vertical direction perpendicular to both said transverse direction and said front-to-back direction, and fixed to at least one of said housing and shell; wherein
    said heat sink is discrete and separable from the module.

12. The electrical connector assembly as claimed in claim 11, wherein said module is configured to be moveable relative to the housing in a rotational manner while said heat sink is configured to be assembled with regard to the housing in the vertical direction.

13. The electrical connector assembly as claimed in claim 11, wherein a top surface of the module is higher than an upper surface of the housing in the vertical direction.

14. The electrical connector assembly as claimed in claim 13, wherein the heat sink is intimately positioned upon the metallic shell.

15. The electrical connector assembly as claimed in claim 14, wherein the housing forms a recess in the upper surface to receive a nut to which a screw extends in the vertical direction to fasten the heat sink to the housing.

16. The electrical connector assembly as claimed in claim 15, wherein said nut is retained under the metallic shell.

17. The electrical connector assembly as claimed in claim 16, wherein said shell forms a hole through which the screw extends in the vertical direction.

18. The electrical connector assembly as claimed in claim 11, wherein said heat sink unitarily forms an ear portion extending horizontally along the front-to-back direction and positioned upon at least one of the shell and the housing, and a fastening device extends through the ear portion to fasten the heat sink to said at least one of the housing and the shell.

19. The electrical connector assembly as claimed in claim 18, wherein said fastening device is a screw extending along the vertical direction.

20. The electrical connector assembly as claimed in claim 19, wherein said shell forms a hole through which the screw extends in the vertical direction.

* * * * *